(12) United States Patent
Bailey et al.

(10) Patent No.: US 11,606,883 B2
(45) Date of Patent: Mar. 14, 2023

(54) METHOD FOR BACKFLOW PREVENTION IN AN AIRFLOW PLENUM OF A MODULAR DATA CENTER

(71) Applicant: DELL PRODUCTS, L.P., Round Rock, TX (US)

(72) Inventors: Mark M. Bailey, Round Rock, TX (US); Trey S. Wiederhold, Cedar Park, TX (US); Ty R. Schmitt, Round Rock, TX (US)

(73) Assignee: Dell Products, L.P., Round Rock, TX (US)

(*) Notice: Subject to any disclaimer, the term of this patent is extended or adjusted under 35 U.S.C. 154(b) by 739 days.

(21) Appl. No.: 16/557,939

(22) Filed: Aug. 30, 2019

(65) Prior Publication Data

US 2021/0068307 A1 Mar. 4, 2021

(51) Int. Cl.
*H05K 7/20* (2006.01)
*F24F 13/10* (2006.01)
*F24F 11/79* (2018.01)
*F24F 140/40* (2018.01)

(52) U.S. Cl.
CPC .......... *H05K 7/20745* (2013.01); *F24F 11/79* (2018.01); *F24F 13/10* (2013.01); *H05K 7/20145* (2013.01); *H05K 7/20172* (2013.01); *H05K 7/20181* (2013.01); *F24F 2140/40* (2018.01)

(58) Field of Classification Search
CPC .......... H05K 7/20745; H05K 7/20145; H05K 7/20172; H05K 7/20181; F24F 11/79; F24F 13/10; F24F 2140/40

USPC ......................................................... 454/184
See application file for complete search history.

(56) References Cited

U.S. PATENT DOCUMENTS

| 6,021,042 A * | 2/2000 | Anderson | H05K 7/2019 165/127 |
| 8,734,212 B2 * | 5/2014 | Peng | H05K 7/1497 361/695 |
| 8,949,091 B2 * | 2/2015 | Bhagwat | H05K 7/20836 703/13 |
| 9,157,536 B2 | 10/2015 | Li | |
| 9,217,576 B2 | 12/2015 | Ikeno et al. | |
| 9,674,989 B2 * | 6/2017 | Zhang | H05K 7/20745 |
| 2005/0159099 A1 * | 7/2005 | Malone | H05K 7/20745 454/186 |

(Continued)

*Primary Examiner* — Avinash A Savani
*Assistant Examiner* — Dana K Tighe
(74) *Attorney, Agent, or Firm* — Isidore PLLC

(57) ABSTRACT

A modular data center (MDC) includes a volumetric container comprising an enclosure having first and second exterior walls at a forward and an aft end, connected by lateral exterior walls. Information technology component(s) are positioned longitudinally within the container between a cold aisle and a hot aisle. An air handling system includes two or more air handling units (AHUs) each having a return air inlet and a supply air outlet. A supply air plenum directs cooling air flow from the supply air outlets to a supply air opening positioned adjacent to the cold aisle. Backflow prevention mechanisms are positioned respectively at each supply air outlet of the AHUs. Each backflow prevention mechanism is moveable into an open position to allow cooling air flow out of the supply air outlet of a corresponding AHU and a closed position in response to deactivation of an air mover of the corresponding AHU.

20 Claims, 13 Drawing Sheets

(56) References Cited

U.S. PATENT DOCUMENTS

2015/0116929 A1 4/2015 Shabbir et al.
2016/0198593 A1 7/2016 Schmitt et al.

* cited by examiner

METHOD FOR BACKFLOW PREVENTION IN AN AIRFLOW PLENUM OF A MODULAR DATA CENTER

BACKGROUND

1. Technical Field

The present disclosure relates in general to air handling within a modular data center (MDC), and more particularly to directing supply air from air handling units (AHUs) within an MDC.

2. Description of the Related Art

As the value and use of information continue to increase, individuals and businesses seek additional ways to process and store information. One option available to users is information handling systems (IHSs). An IHS generally processes, compiles, stores, and/or communicates information or data for business, personal, or other purposes, thereby allowing users to take advantage of the value of the information. Because technology and information handling needs and requirements vary between different users or applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

A data center houses IHSs and associated components, such as telecommunications and storage systems. A modular data center (MDC) system is a deployable data center. A MDC can be placed anywhere data/processing capacity is needed. MDC systems consist of purpose-engineered modules and components that offer scalable data center capacity with multiple power and cooling options. Modular edge data centers (MEDCs) are generally smaller MDC facilities that extend the edge of the network to deliver cloud computing resources and cached streaming content to local end users. An effective use of space in a MEDC involves arranging an array of information technology (IT) racks in a straight line between hot and cold aisles. This arrangement allows for concurrent removal of racks and allows service from both hot and cold aisles. MEDCs are generally designed to ship over land transportation routes. The straight longitudinal line arrangement of IT racks in an MEDC makes the MEDC suitable for lateral road width restrictions.

MEDCs are cooled using air handling units (AHUs). Using wall-mounted AHUs rather than top-mounted AHUs typically provides the lowest installed cost. However, wall mounting the AHUs along the exterior wall adjacent to the cold aisle before travel would cause the shipping MEDC to exceed the lateral road width limitations. Alternatively, rearranging the MEDC layout to accommodate wall-mounted AHUs on a lateral side of the MEDC compromises the optimized straight longitudinal line of IT racks between hot and cold aisles.

BRIEF SUMMARY

In accordance with the teachings of the present disclosure, an air handling system includes two or more adjacent air handling units (AHUs) each having a return air inlet and a supply air outlet. A supply air plenum is provided in fluid communication with the supply air outlets of the two or more AHUs. The supply air plenum directs cooling air flow from the supply air outlets to a supply air opening positioned adjacent to a cold aisle of a data center. The air handling system includes two or more backflow prevention mechanisms. Each backflow prevention mechanism is positioned respectively at each supply air outlet of the two or more AHUs. Each backflow prevention mechanism is moveable into an open position to allow cooling air flow out of the supply air outlet of a corresponding AHU. Each backflow prevention mechanism is moveable into a closed position in response to deactivation of an air mover of the corresponding AHU.

In accordance with the teachings of the present disclosure, a modular data center (MDC) has a volumetric container comprising an enclosure having first and second exterior walls at a forward and an aft end, connected by lateral exterior walls. At least one heat generating information technology (IT) component is positioned longitudinally within the container between a cold aisle and a hot aisle that run longitudinally along respective left and right interior sides of the volumetric container. An air handling system of the MDC includes two or more AHUs each having a return air inlet and a supply air outlet. A supply air plenum of the air handling system is provided in fluid communication with the supply air outlets of the two or more AHUs. The supply air plenum directs cooling air flow from the supply air outlets to a supply air opening positioned adjacent to the cold aisle of the MDC. The air handling system includes two or more backflow prevention mechanisms. Each backflow prevention mechanism is positioned respectively at each supply air outlet of the two or more AHUs. Each backflow prevention mechanism is moveable into an open position to allow cooling air flow out of the supply air outlet of a corresponding AHU. Each backflow prevention mechanism is moveable into a closed position in response to deactivation of an air mover of the corresponding AHU.

In accordance with the teachings of the present disclosure, a method is provided for installing an air handling system of a MDC having IT components placed between a cold aisle and a hot aisle extending longitudinally within the MDC. The method includes positioning a supply air plenum along an exterior wall of a volumetric container of the MDC with a supply air opening of the supply air plenum positioned adjacent to the cold aisle of the MDC. The method includes positioning two or more AHUs adjacent to the supply air plenum and the exterior wall of the volumetric container of the MDC. The two or more AHUs each have a return air inlet and a supply air outlet. The method includes coupling the supply air outlets of the two or more AHUs for fluid communication with the supply air plenum to direct supply air from the supply air outlets of the two or more AHUs to the supply air opening of the supply air plenum. The method includes attaching a backflow prevention mechanism to each supply air outlet of the two or more AHUs. Each backflow prevention mechanism is moveable into an open position to allow cooling air flow out of the supply air outlet of a corresponding AHU. Each backflow prevention mechanism is moveable into a closed position in response to deactivation of an air mover of the corresponding AHU.

The above presents a general summary of several aspects of the disclosure to provide a basic understanding of at least some aspects of the disclosure. The above summary contains simplifications, generalizations and omissions of detail and is not intended as a comprehensive description of the claimed subject matter but, rather, is intended to provide a brief overview of some of the functionality associated therewith. The summary is not intended to delineate the scope of the claims, and the summary merely presents some concepts of the disclosure in a general form as a prelude to the more detailed description that follows. Other systems, methods, functionality, features and advantages of the claimed subject matter will be or will become apparent to one with skill in the art upon examination of the following figures and detailed written description.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which.

DETAILED DESCRIPTION

Figure 1:
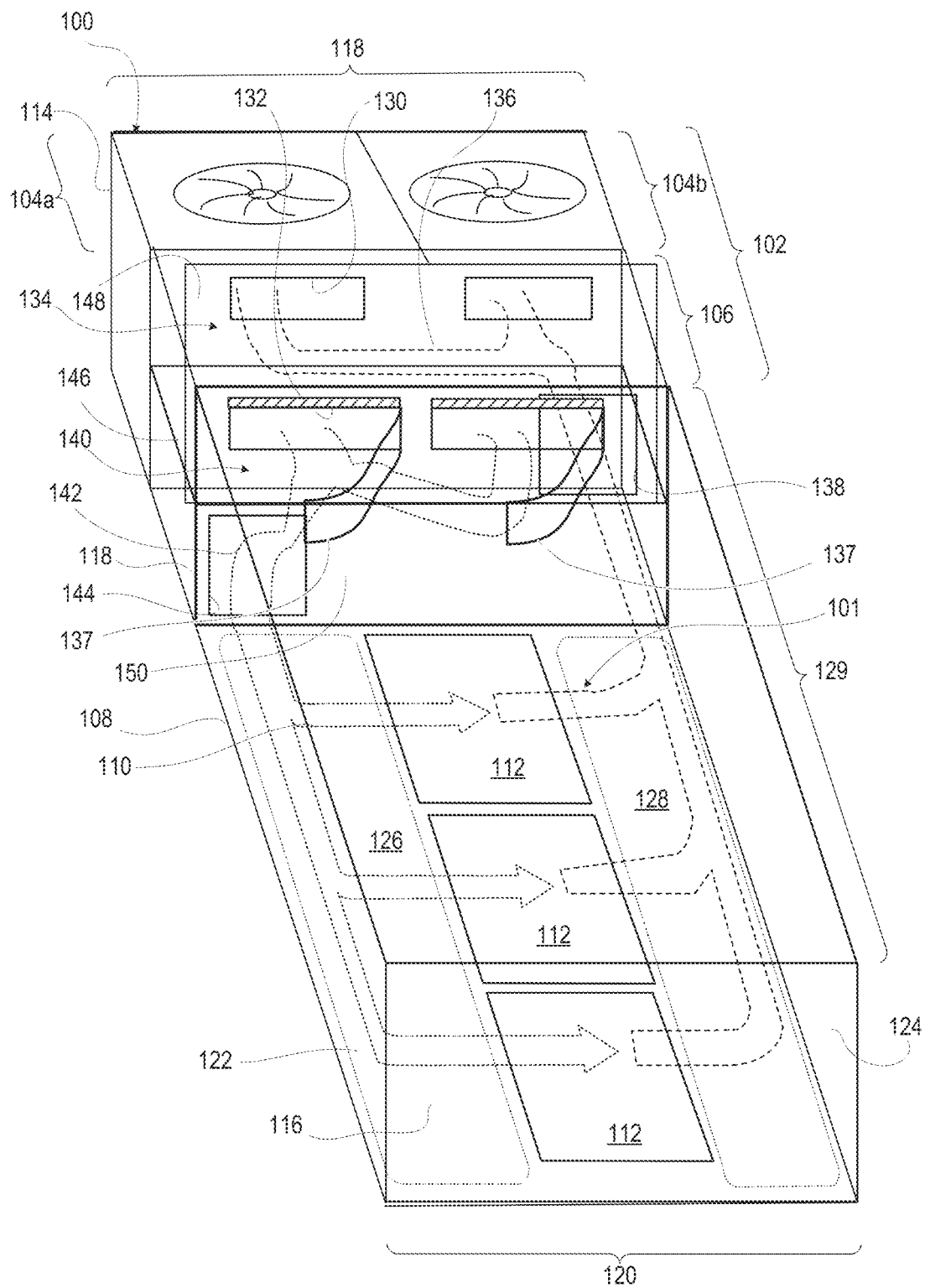
FIG. 1 is a diagram of a modular data center (MDC) having air cooling circulation pattern provided by an air handling system having backflow prevention, according to one or more embodiments.

According to aspects of the present disclosure, an air handling system, a modular data center (MDC) that includes the air handling system, and methods of installing the air handling system of the MDC are provided. The present disclosure enables economical assembly and road transport of the MDC. The MDC has a volumetric container comprising an enclosure having first and second exterior walls at a forward and an aft end, connected by lateral exterior walls. At least one heat generating information technology (IT) component is positioned longitudinally within the container between a cold aisle and a hot aisle, which extend longitudinally along respective left and right interior sides of the volumetric container. An air handling system of the MDC includes two or more AHUs each having a return air inlet and a supply air outlet. A supply air plenum of the air handling system is placed in fluid communication with the supply air outlets of the two or more AHUs. The supply air plenum directs cooling air flow from the supply air outlets to a supply air opening positioned adjacent to the cold aisle of the MDC. The air handling system includes two or more backflow prevention mechanisms. Each backflow prevention mechanism is positioned respectively at each supply air outlet of the two or more AHUs. Each backflow prevention mechanism is moveable into an open position to allow cooling air flow out of the supply air outlet of a corresponding AHU. Each backflow prevention mechanism is moveable into a closed position in response to deactivation of an air mover of the corresponding AHU.

References within the specification to "one embodiment," "an embodiment," "embodiments", or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various requirements are described which may be requirements for some embodiments but not other embodiments.

It is understood that the use of specific component, device and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that terms is utilized.

FIG. 1 depicts MDC 100 having air cooling circulation pattern 101 provided by dual air handling system 102 that includes first AHU 104a, second AHU 104b, and air redirection structure 106 with backflow prevention. AHUs 104a, 104b each include vertically-spaced cold supply air outlet 132 and one or more hot return air inlets 130. MDC 100 includes volumetric container 108 having enclosure 110 that encloses heat generating IT components 112, such as rack-mounted information handling systems (IHSs). IT components 112 are cooled by air handling system 102. Enclosure 110 of volumetric container 108 includes first (forward) and second (aft) exterior walls 114, 116 at forward and aft ends 118, 120, respectively, that are connected by left and right lateral exterior walls 122, 124. IT components 112 are positioned longitudinally within enclosure 110 of volumetric container 108 between cold aisle 126 and hot aisle 128, which run longitudinally along respective left and right interior sides (relative to a forward end location of AHU 104a, 104b) of volumetric container 108.

For clarity, enclosure 110 of volumetric container 108 includes IT compartment 129 that houses IT components 112 extending from the forward end 118 to the aft end 114 of enclosure 110. Cold aisle 126 extends adjacent to left lateral exterior wall 122. Hot aisle 128 extends adjacent to right lateral exterior wall 124. Air handling system 102 is positioned at the forward end 118 of enclosure 110. In one or more alternate embodiments, air handling system 102 is positioned at aft end 120 instead of forward end 118. Also, in one or more alternate embodiments, cold aisle 126 can extended adjacent to right lateral exterior wall 124 and hot aisle 128 can extend adjacent to left lateral exterior wall 122. In one or more embodiments, volumetric container 108 can be interchangeably placed on a road transport trailer (not shown) to be moved. AHUs 104a, 104b are depicted at forward end 118 when transported in this orientation. AHUs 104a, 104b can also be at aft end 120 (not shown) when volumetric container 108 is placed in the opposite orientation. In one or more embodiments, MDC 100 is transported with or without IT components 112. When shipped with IT components 112, IT components 112 can be locally powered and/or networked or operably coupled to power and telecommunication subsystems available at a deployed location. In the provided embodiments, MDC 100 can include additional power and telecommunication components to support operation while MDC is being transported, as the configuration allows for attachment and use of the air handling units without making the combined unit too wide for ground transportation. In one or more embodiments, aspects of the present innovation are incorporated into data centers that are not modular or mobile.

First and second AHUs 104a, 104b of dual air handling system 102 each have return air inlet 130 and supply air outlet 132 that are vertically spaced relative to each other. Air redirection structure 106 of dual air handling system 102 includes return air plenum 134 that is in fluid communication with and vertically aligned to return air inlets 130 of first and second AHUs 104a, 104b. As utilized herein, fluid communication between two components means that the body of circulating air (representing the fluid) moves from one component to the other. As utilized herein, plenum means the state or a space in which a gas, usually air as in this case, is contained. In particular, plenum means a space that can serve as a receiving chamber for air that has been heated or cooled to be distributed to areas requiring this air. Return air plenum 134 directs return air 136 from return air opening 138 of air redirection structure 106 to return air inlets 130 of first and second AHUs 104a, 104b. Return air opening 138 is positioned adjacent to hot aisle 128 of volumetric container 108. Air redirection structure 106 of dual air handling system 102 includes supply air plenum 140 that is in fluid communication with and vertically aligned to supply air outlets 132 of first and second AHUs 104a, 104b. Supply air plenum 140 directs supply air 142 from supply air outlets 132 of first and second AHUs 104a, 104b to supply air opening 144. Supply air opening 144 is positioned to provide supply air 142 to cold aisle 126 of volumetric container 108.

In the illustrated embodiments, return air inlets 130 of first and second AHUs 104a, 104b are above supply air outlets 132. Also, return air plenum 134 is above supply air plenum 140 and separated from supply air plenum 140 by a horizontal partition 146. In one or more embodiments, the reversed or opposite vertical positions of return air plenum 134 and supply air plenum 140 can be used.

In one or more embodiments, air redirection structure 106 includes first vertical panel 148 that has respective, vertically-spaced interface apertures (not shown) that align with return air inlet 130 and supply air outlets 132 of first and second AHUs 104a, 104b. Air redirection structure 106 includes second vertical panel 150 that includes return air opening 138 and supply air openings 144. Horizontal partition 146 is attached between first and second vertical panels 148, 150 separating return air plenum 134 from supply air plenum 140. First vertical panel 148 is located adjacent to AHUs 104a, 104b and second vertical panel 150 is opposite to first vertical panel 148 and located adjacent to the forward/aft wall of volumetric container 108. Horizontal partition 146 separates return air inlets 130 and return air opening 138 from supply air outlets 132 and supply air opening 144. Horizontal partition 146 is air-tight, preventing exchange of supply air flow and return air flow within respective air plenums (134, 140).

In one or more embodiments, neither of return air inlet 130 and supply air outlet 132 is aligned with the corresponding one of the return air opening 138 and the supply air opening 144, and air redirection structure 106 laterally redirects both return air 136 and supply air 142. In one or more embodiments, one of the return air inlet 130 and supply air outlet 132 is aligned with its corresponding one of the return air opening 138 and the supply air opening 144. The other one of the return air inlet 130 and supply air outlet 132 is not aligned with the corresponding one of the return air opening 138 and the supply air opening 144. In these embodiments, air redirection structure 106 provides lateral redirection for the corresponding one but not the other of the return air 136 and supply air 142 to mitigate the non-alignment. The redirection allows positioning of two or more vertically-arranged AHUs 104a, 104b in an upright position at an aft/forward end of MDC 100, enabling land transportation via roads.

One of two backflow prevention mechanisms 137 is positioned respectively at each supply air outlet 132 of AHU 104. Each backflow prevention mechanism 137 is moveable into an open position, as depicted, to allow cooling air flow out of supply air outlet 132 of corresponding AHU 104. Each backflow prevention mechanism 137 is moveable into a closed position (not shown) in response to deactivation of an air mover (not shown) of corresponding AHU 104a, 104b. In one or more embodiments, backflow prevention mechanisms 137 include a door or flap that pivots about a horizontal or vertical axis from a closed position to an open position. The open and closing is thus controlled by the pressure or force of air flowing out of the supply air outlet 132 of corresponding AHU 104a, 104b.

Figure 2:
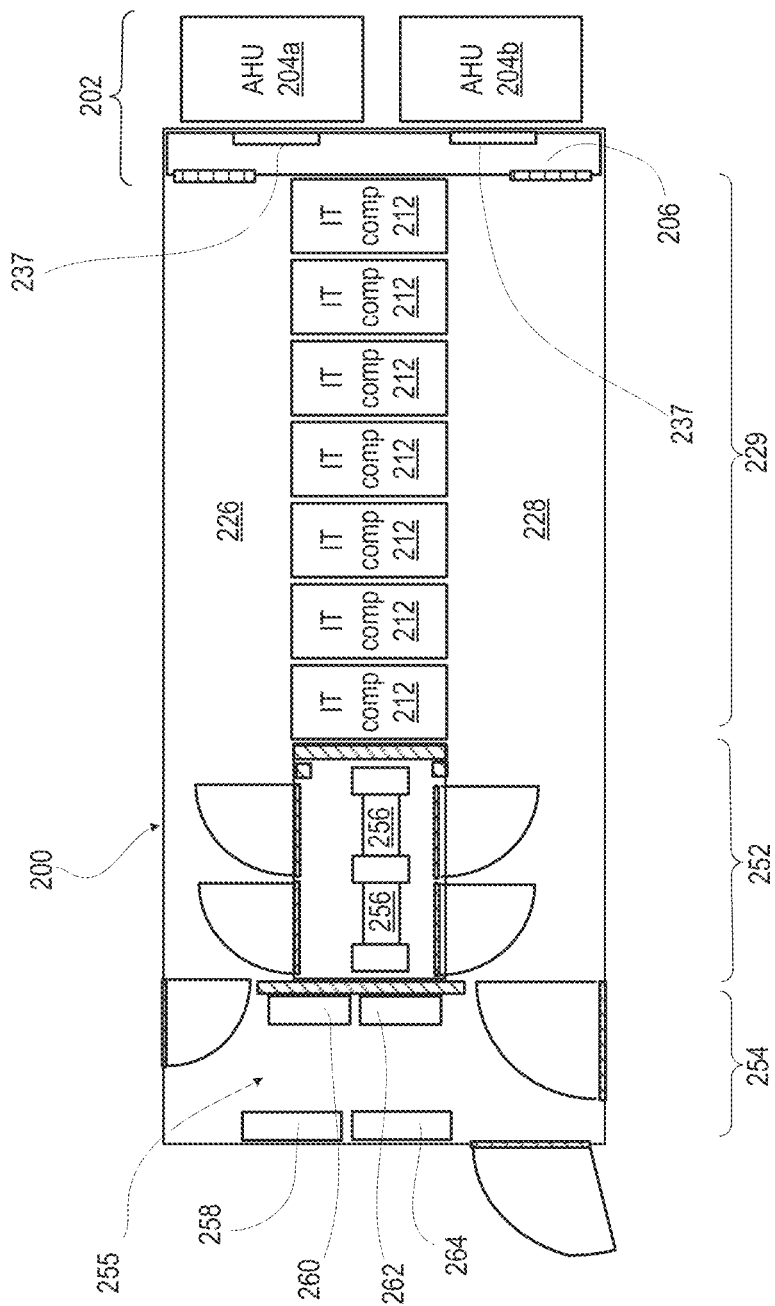
FIG. 2 is a top view of an example MDC having two forward-mounted or aft-mounted air handling units (AHUs) providing cooling to an information technology (IT) compartment and a meet-me compartment within the MDC, according to one or more embodiments.

FIG. 2 is a block diagram depiction of example MDC having two forward-mounted or aft-mounted AHUs 204a, 204b providing cooling to modular edge data center (MEDC) 200. Volumetric container 208 of MEDC 200 includes enclosure 210 that is configured with IT compartment 229, meet me compartment 252, and utility room 254. IT compartment 229 includes a longitudinal row of IT components 212 between cold and hot aisles 226, 228. Meet me compartment 252 includes vendor service cabinets 256 for equipment such as network services, telecommunication services, etc. In one or more embodiments, meet me compartment 252 can be accessible to vendors, whereas IT compartment 229 can be accessible to only employees that report to an operator of IT components 212. Meet me compartment 252 can also provide an on-site meeting location for personnel. Utility room 254 includes infrastructure support components 255 such as power input panel 258, security panel 260, control panel 262, and modular data center interconnect (MDCI) graphical user interface (GUI) console 264. Dual-AHU air handling system 202 of MEDC 200 includes two forward-mounted or aft-mounted AHUs 204a, 204b, with the directional placement of the AHUs being interchangeable in different designs. AHUs 204a, 204b exchange cooling air, via air redirection structure 206 with cold and hot aisles 226, 228 inside of enclosure 210. Cooling air moves from cold aisle 226 to hot aisle 228 to cool heat-generating IT components 212 in IT compartment 229, vendor service cabinets 256 in meet-me compartment 252, and infrastructure support components 255 in utility room 254. Each AHU 204a, 204b includes backflow prevention mechanism 237.

Figure 3:
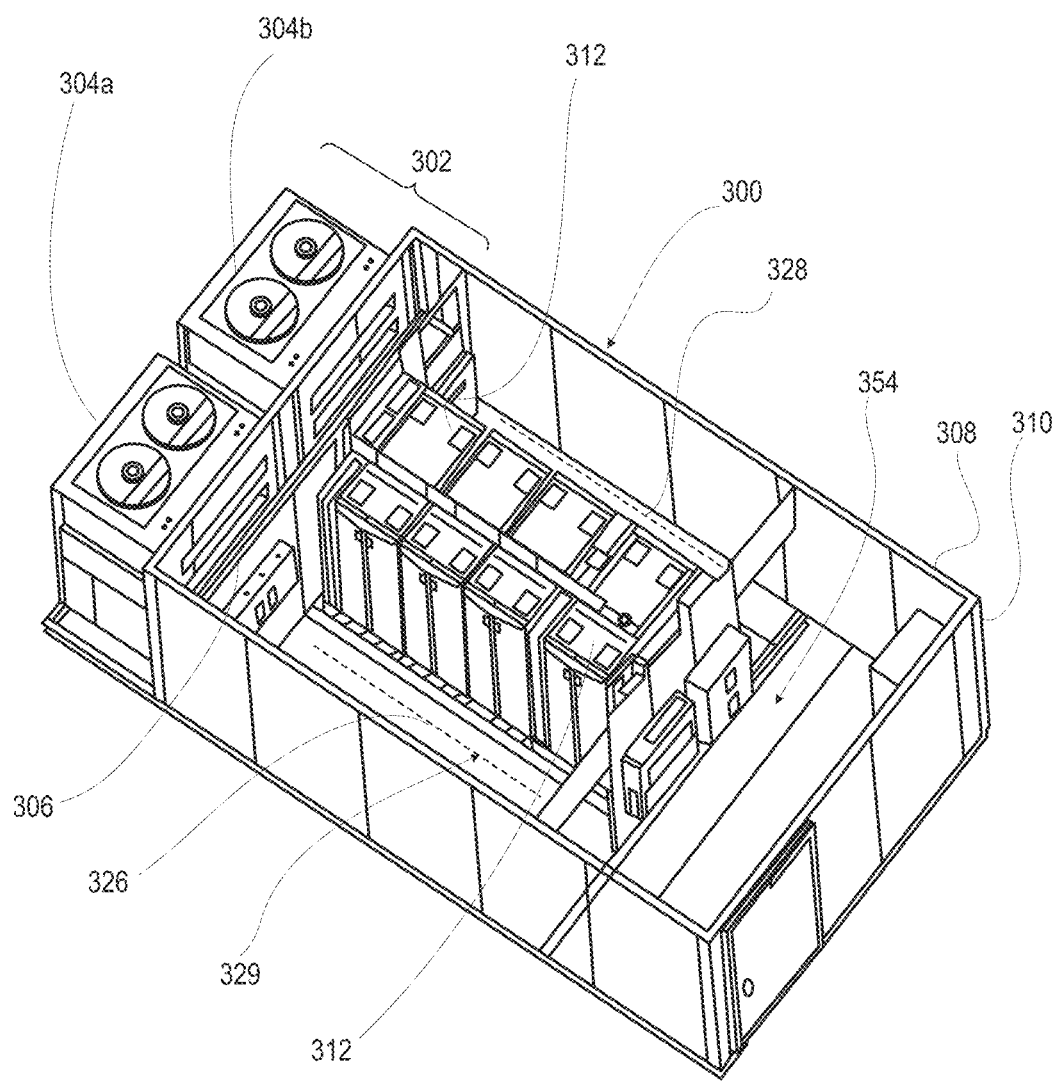
FIG. 3 is a top view of an example MDC having an IT compartment and utility room that are cooled by channeling air from and to external AHUs using an air redirection structure, according to one or more embodiments.

FIG. 3 depicts a three-dimensional, top view of example MEDC 300 that is cooled by dual air handling system 302 channeling air from and to external AHUs 304a, 304b using air redirection structure 306. MEDC 300 has IT compartment 329 and utility room 354 within enclosure 310 of volumetric container 308. IT compartment 329 includes a longitudinal row of IT components 312 between cold and hot aisles 326, 328. Dual-AHU air handling system 302 of MEDC 300 includes two forward-mounted or aft-mounted AHUs 304a, 304b. AHUs 304a, 304b exchange cooling air via air redirection structure 306 with the IT compartment 329 and utility room 354 via cold and hot aisles 326, 328.

Figure 4:
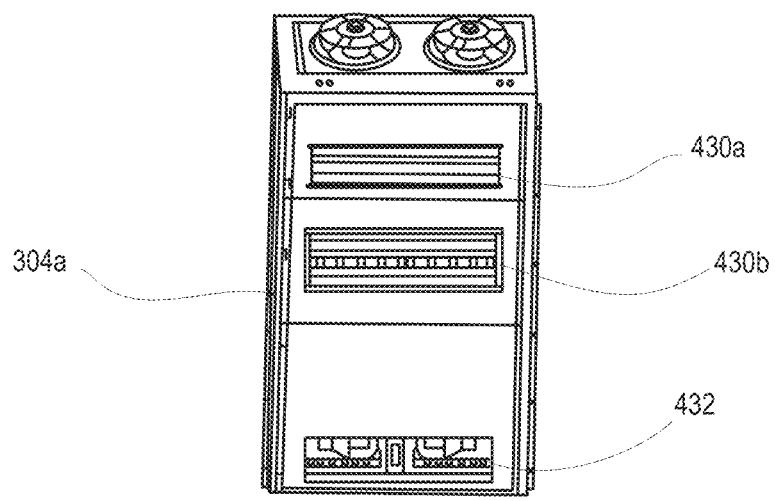
FIG. 4 is a front view of an example AHU of the MDC of FIG. 3 with vertically-spaced cold air outlet and hot air inlet, according to one or more embodiments.

FIG. 4 is a front view of example wall-mount AHU 304a with vertically-spaced cold supply air outlet 432 and dual stacked return air inlets 430a, 430b. Return air inlets 430a, 430b are used for different cooling modes (e.g., closed loop (recycled air), open loop (venting), mixed mode (partially recycled and partially exhausted). Supply air outlet 432 is vertically spaced below return air inlets 430a, 430b.

Figure 5:
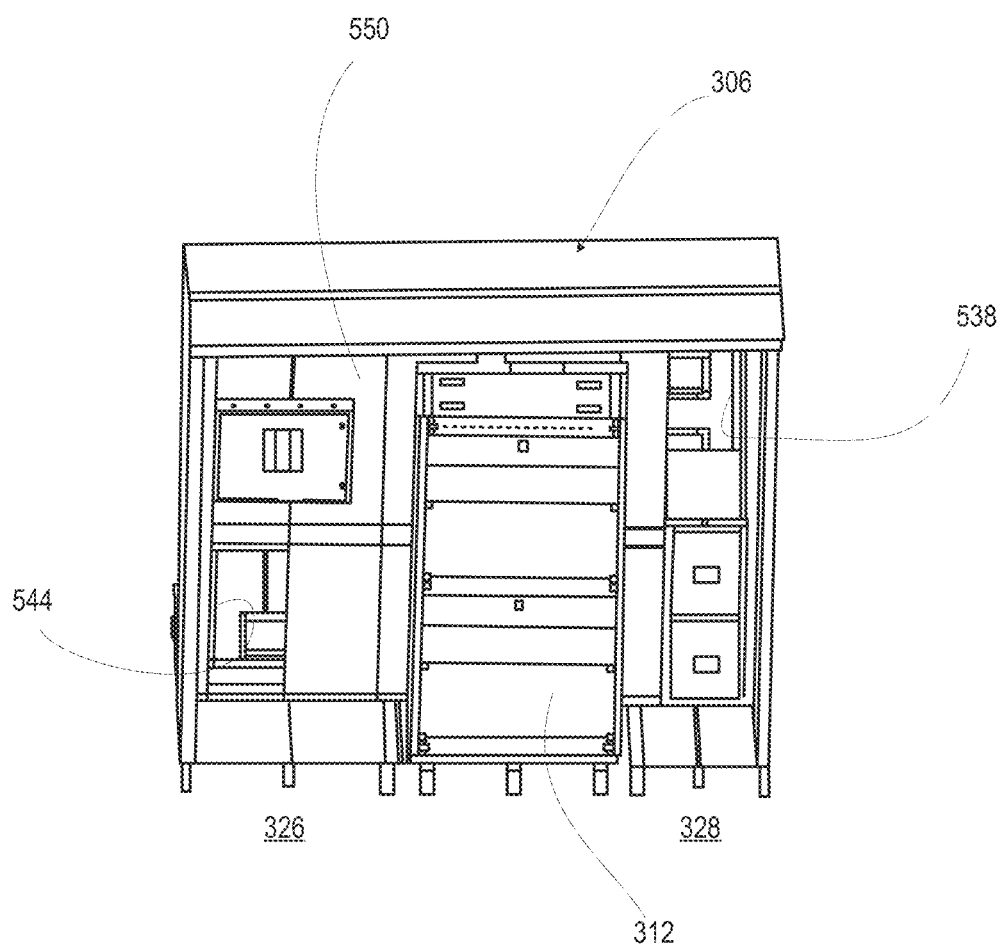
FIG. 5 is a front view of an example air handling system of FIG. 3, according to one or more embodiments.

FIG. 5 is a three-dimensional view of second vertical panel 550 of air redirection structure 306 configured to provide air cooling to IT component 312 that extends longitudinally away from second vertical panel 550 into enclosure 310 of MDC 300 (FIG. 3). Second vertical panel 550 includes supply air opening 544 that provides cooling air to cold aisle 326 of the enclosure. The cooling air passes through IT component 312 to hot aisle 328 and returns through return air opening 538.

Figure 6:
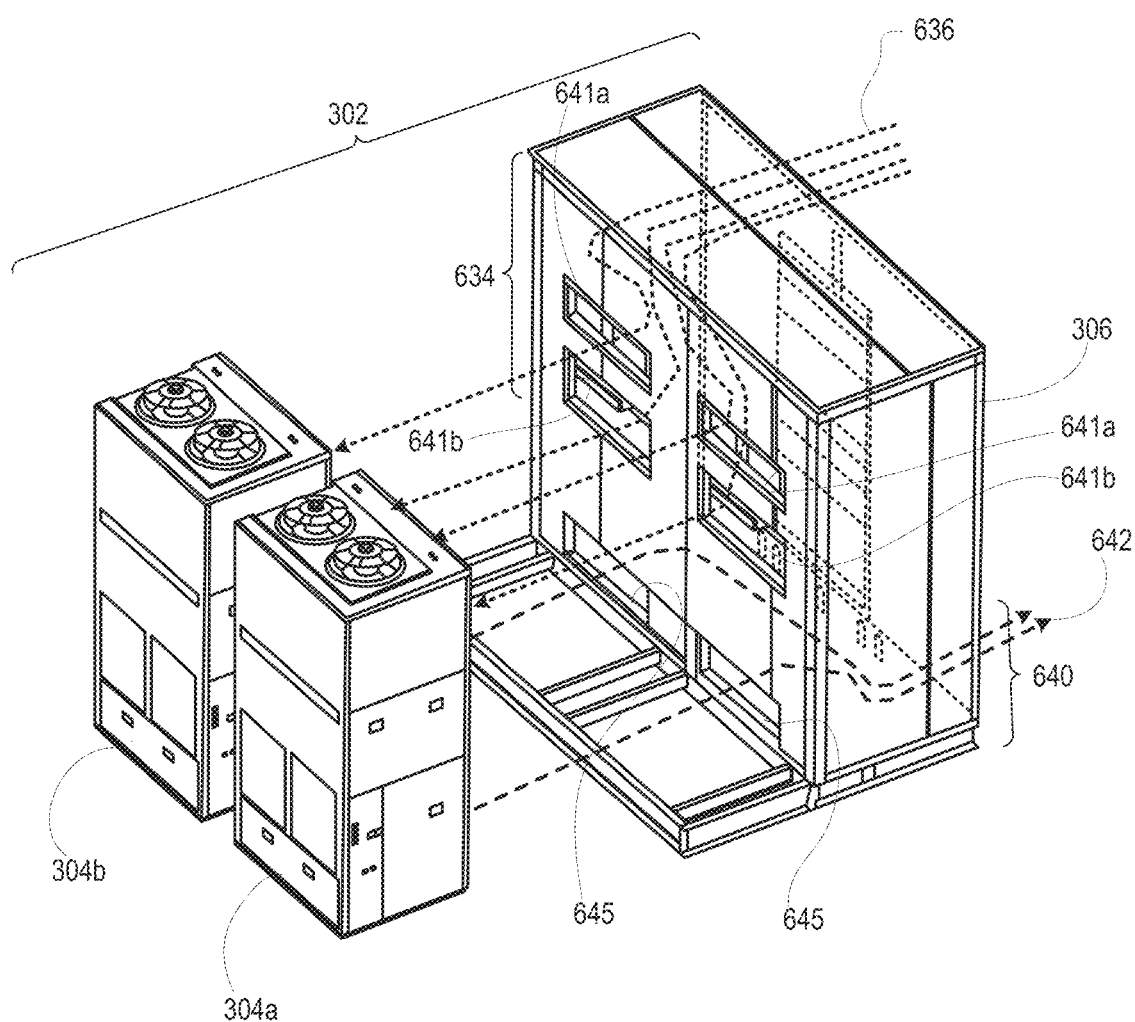
FIG. 6 is a three-dimensional view of the two AHUs separated from the example air redirection structure of FIG. 3, according to one or more embodiments.

FIG. 6 depicts a separated view of dual-AHU air handling system 302, with first and second AHUs 304a, 304b separated from air redirection structure 306. Return air 636 is directed through return air plenum 634 and out of air redirection structure 306 via return air inlet interface apertures 641a, 641b. Return air inlet interface apertures 641a, 641b are in fluid communication with return air intakes (not shown) of AHUs 304a, 304b. After mechanical cooling and/or replacement with ambient air, AHUs 304a, 304b provide supply air 642 via respective supply air outlets (not shown) into supply air outlet interface aperture 645. Supply air plenum 640 receives and directs supply air 642 within air redirection structure 306.

Figure 7:
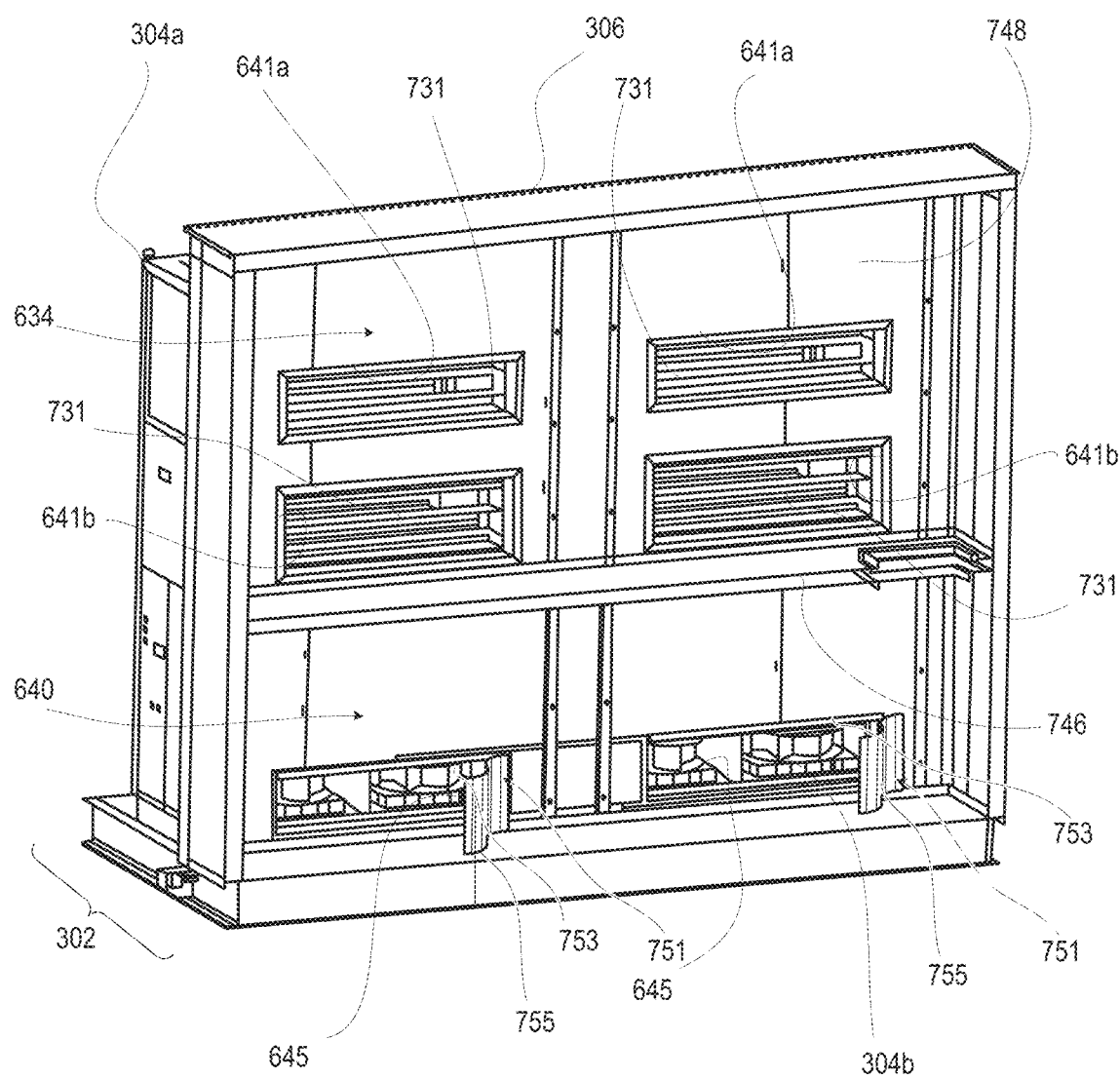
FIG. 7 is a three-dimensional cutaway view of the air handling system of FIG. 3 with two backflow prevention mechanisms in an open position, according to one or more embodiments.

FIG. 7 is a three-dimensional cutaway view of the interior of air redirection structure 306 of dual-AHU air handling system 302 assembled with AHUs 304a, 304b. First vertical panel 748 is separated into return air plenum 634 and supply air plenum 640 by horizontal partition 746. Return air inlet interface apertures 641a, 641b in return air plenum 634 provide interface respectively to return air inlets 430a, 430b of AHUs 304a, 304b (FIG. 4). Each return air inlet interface aperture 641a, 641b is opened and closed by corresponding return inlet louver 731. Return air inlets 430a, 430b enter corresponding AHUs 304a, 304b (FIG. 4) separately to support different modes of air cooling. One mode can be selected by closing one of return air inlets 430a, 430b using corresponding return inlet louver 731. An example mode is closed-loop recirculation of return air for increasing dew point of the air or to warm IT components 112 (FIG. 1) that are below a specified operating temperature range. An example mode is open venting of return air that is replaced with cool ambient air from outside of MDC 300 (FIG. 3). An example mode is mechanical cooling of the return air. Two example modes can be performed as a mixed mode by opening both return air inlets 430a, 430b using corresponding return inlet louver 731. The present disclosure provides closing both return air inlets 430a, 430b using corresponding return inlet louvers 731 to prevent backflow when one AHU 304a, 304b is not activated or installed. Supply air outlet interface apertures 645 in supply air plenum 640 provide interface to supply air outlets 432 of AHUs 304a, 304b (FIG. 4). In one or more embodiments, backflow prevention mechanisms 751 include a drop-down flap or door 753 with air turning vane 755.

Figure 8:
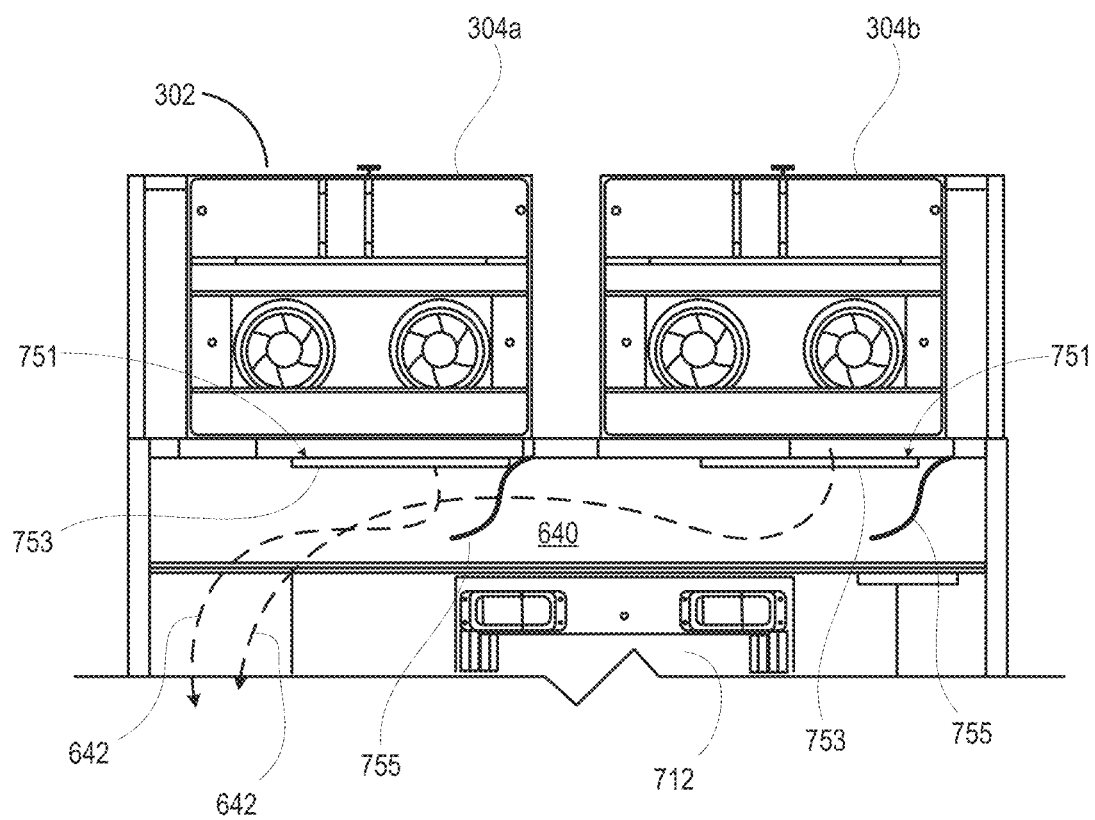
FIG. 8 is a top cutaway view of the air handling system of FIG. 7, according to one or more embodiments.

FIG. 8 is a top cutaway view of air handling system 302. Air turning vane 755 is a stationary barrier that redirects horizontally and longitudinally moving supply air to one lateral side toward supply air opening 544 (FIG. 5). Air turning vane 755 is a curved surface that assists in redirecting supply air to one lateral side. Air turning vane 755 curves toward the second lateral side flap attached along one edge of respective supply air outlet interface apertures 645. The curved redirection of the supply air reduces turbulence within supply air plenum 640 and increasing rate of air flow. Drop down flap or door 753 includes a biasing structure that moves flap or door 753, which is actively actuated or passively overcome when the corresponding air mover of AHU 304a, 304b (FIG. 4) is activated to enable flap or door 753 to move into the open position. Biasing structure can be an electrically activated actuator that moves and maintains the flap or door 753 in one of the open and closed positions.

In one or more embodiments, biasing structure can be a mechanical restoring force provided by a compression spring, torsion spring, tension spring, pneumatic cylinder, etc. Biasing structure provides a force that moves and maintains the flap or door 753 in one of the open and closed positions but whose force is insufficient to maintain this position when corresponding AHU 304a, 304b (FIG. 4) is activated. Flow of supply air overcomes the passive force of the biasing structure that is not actively powered.

Figure 9:
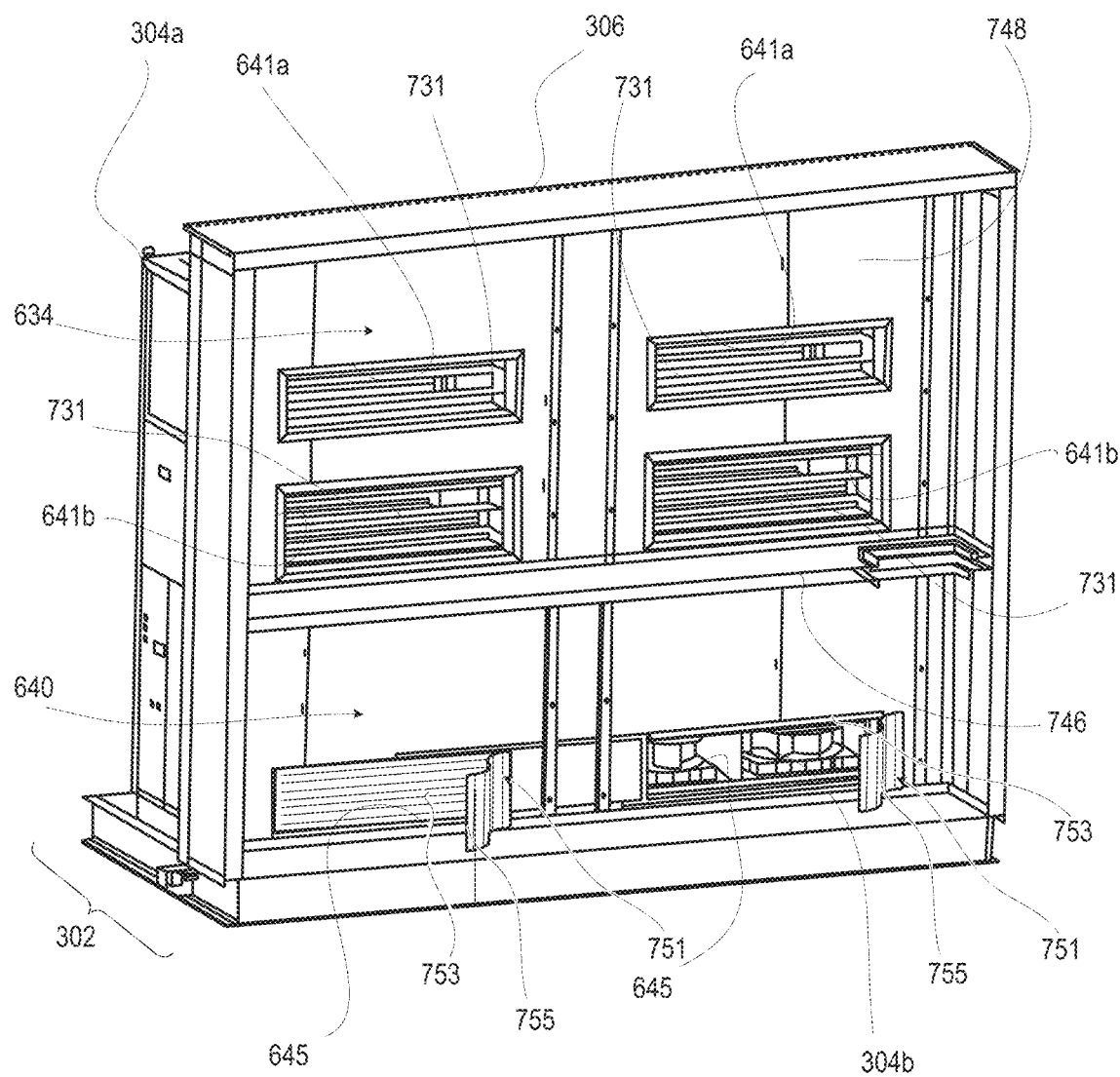
FIG. 9 is a three-dimensional cutaway view of the air handling system of FIG. 2 or 3 with the two backflow prevention mechanisms respectively in open and closed positions, according to one or more embodiments.
Figure 10:
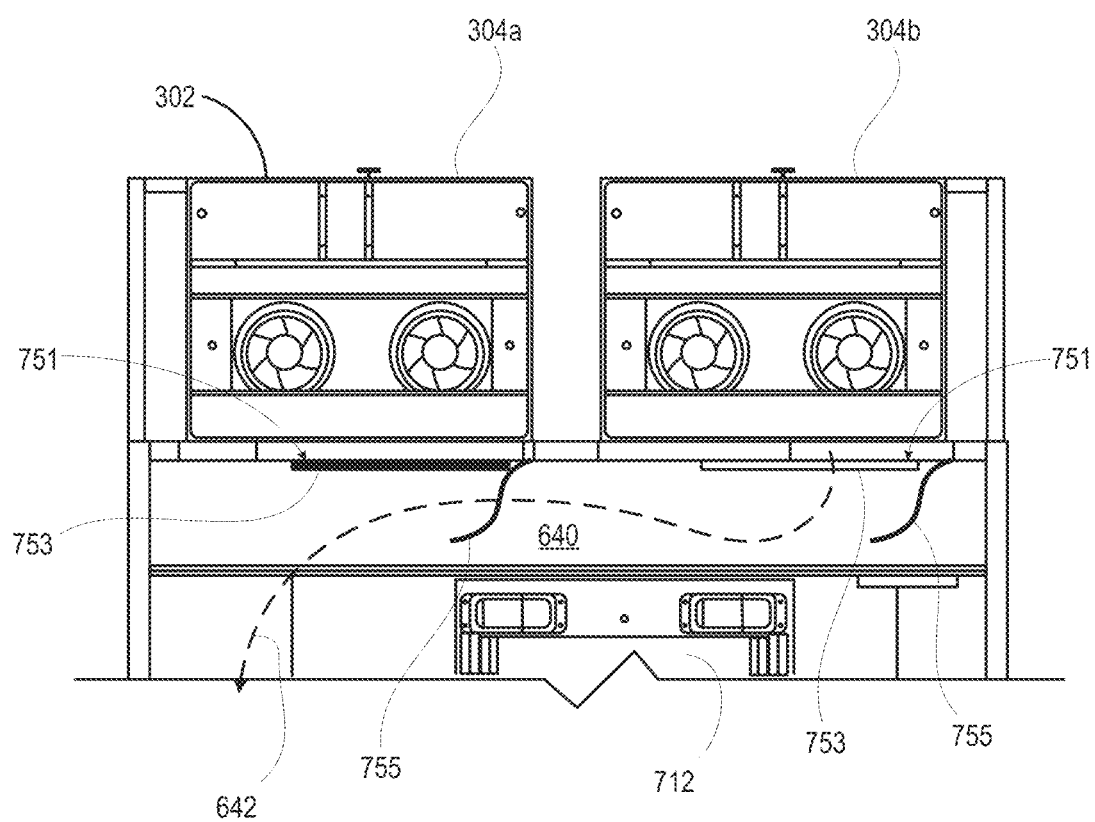
FIG. 10 is a top cutaway view of the air handling system of FIG. 9, according to one or more embodiments.

FIG. 9 is a three-dimensional cutaway view of air handling system 302 with two backflow prevention mechanisms 751 respectively in open and closed positions that correspond to an activated and deactivated state respectively of AHUs 304a, 304b (FIG. 4). FIG. 10 is a top cutaway view of air handling system 302 with two backflow prevention mechanisms 751 respectively in open and closed positions that correspond to an activated and deactivated state respectively of AHUs 304a, 304b (FIG. 4). Within the figure, AHU 304a is inactive, providing no supply air. Corresponding flap or door of backflow prevention mechanisms 751 is closed, preventing any positive air pressure in supply air plenum 640 from entering AHU 304a. AHU 304b is active providing supply air 642 that creates the positive air pressure in supply air plenum 640. Air turning vane 755 laterally directs supply air 642 from AHU 304b toward supply air opening 544 (FIG. 5).

Figure 11:
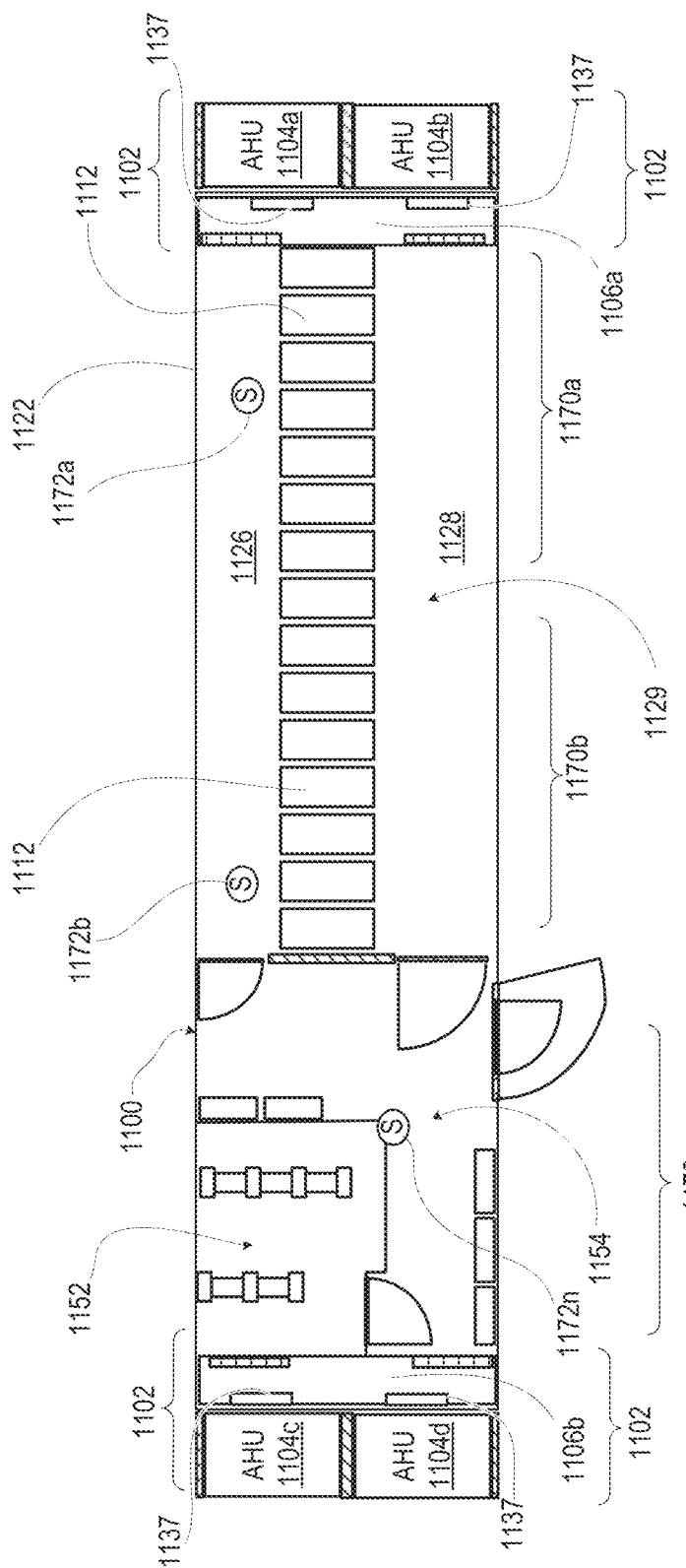
FIG. 11 is a top view of an example MDC having two forward-mounted and two aft-mounted AHUs, an IT compartment, and an equipment (meet me) compartment, according to one or more embodiments.

FIG. 11 depicts example MDC 1100 having two separate dual-AHU of air handling system 1102 providing cooling from opposite ends of the MDC 1100 to each of multiple compartments within MEDC 1100. Each AHU 1104a-d has backflow prevention mechanism 1137. For simplicity, the complete configuration is referred to herein as a "quad-AHU air handling system" to distinguish from the dual-AHU air handling system. As shown, MEDC 1100 includes IT compartment 1129, meet-me compartment 1152, and utility room 1154. IT compartment 1129 includes a longitudinal row of IT components 1112 between cold and hot aisles 1126, 1128. Quad-AHU air handling system 1102 of MEDC 1100 includes two forward-mounted left and right AHUs 1104a, 1104b and two aft-mounted left and right AHUs 1104c-1104d. Front AHUs 1104a, 1104b exchange cooling air via front air redirection structure 1106a with cold and hot aisles 1126, 1128. Aft AHUs 1104c, 1104d exchange cooling air via aft air redirection structure 1106b directly with meet me compartment 1152, and utility room 1154 and indirectly with cold and hot aisles 1126, 1128. Cooling requirements can be provided by selective activation and rate of cooling set for each AHU 1104a-1104d for two or more zones of multiple cooling zones 1170a, 1170b, . . . 1170n of the entire enclosure of MDC 100. According to one aspect, quad-AHU air handling system 1102 determines cooling requirements based on environmental sensors 1172a, 1172b, . . . 1172n in respective zones 1170a, 1170b, . . . 1170n.

Figure 12:
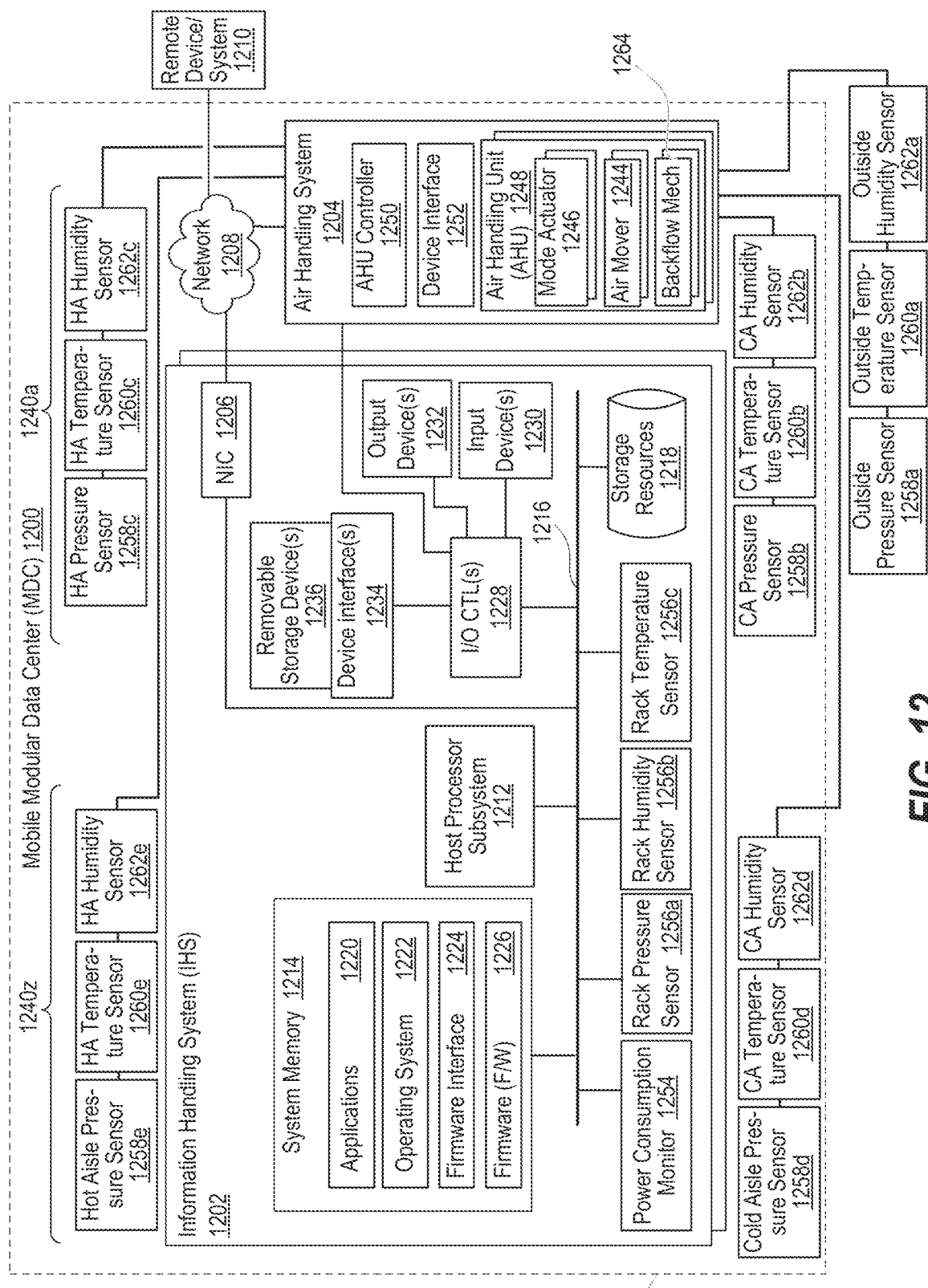
FIG. 12 is a simplified functional block diagram illustrating a mobile MDC having information handling systems (IHSs) with environmental sensors used to control AHUs within an air handling system, according to one or more embodiments.

FIG. 12 is a simplified functional block diagram of mobile MDC 1200 having IT components such as information handling systems (IHSs) 1202 with environmental sensors used to control AHUs 1248 within air handling system 1204. Air handling system 1204 can be dual-AHU or quad-AHU air handling systems or other numbers and arrangements of AHUs 1248. Within the general context of IHSs, IHS 1202 may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, IHS 1202 may be a personal digital assistant (PDA), a consumer electronic device, a network storage device, or any other suitable device and may vary in size, shape, performance, functionality, and price. The information handling system may include random access memory (RAM), one or more processing resources such as a central processing unit (CPU) or hardware or software control logic, read only memory (ROM), and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components. In one or more embodiments, IHS 1202 is a rack-mounted to provide computing, communication and storage functionality in mobile MDC 1200.

IHS 1202 includes a network interface, depicted as network interface controller (NIC) 1206, in communication via network 1208 for receiving IHS updates and work requests from remote devices and systems 1210. NIC 1206 enables IHS 1202 and/or components within IHS 1202 to communicate and/or interface with other devices, services, and components that are located external to IHS 1202. These devices, services, and components can interface with IHS 1202 via an external network, such as network 1208, using one or more communication protocols that include transport control protocol (TCP/IP) and network block device (NBD) protocol. Network 1208 can be a local area network, wide area network, personal area network, and the like, and the connection to and/or between network 1208 and IHS 1202 can be wired, wireless, or a combination thereof. For purposes of discussion, network 1208 is indicated as a single collective component for simplicity. However, it should be appreciated that network 1208 can comprise one or more direct connections to other devices as well as a more complex set of interconnections as can exist within a local area network or a wide area network, such as the Internet.

A host processor subsystem 1212 is coupled to system memory 1214 via system interconnect 1216. System interconnect 1216 can be interchangeably referred to as a system bus, in one or more embodiments. System interconnect 1216 may represent a variety of suitable types of bus structures, e.g., a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, and Video Electronics Standards Association (VESA) local bus. For the purpose of this disclosure, system interconnect 1216 can also be a Double Data Rate (DDR) memory interface. The system memory 1214 can either be contained on separate, removable dual inline memory module (RDIMM) devices or system memory 1214 can be contained within persistent memory devices such as non-volatile dual in-line memory modules (NVDIMMs). For example, the NVDIMM-N variety of NVDIMMs contain both random access memory, which can serve as system memory 1214, and non-volatile memory. It should be noted that other channels of communication can be contained within system interconnect 1216, including but not limited to i2c or system management bus (SMBus). System interconnect 1216 communicatively couples various system components. Examples of system components include replaceable local storage resources 1218 such as solid state drives (SDDs) and hard disk drives (HDDs). Software and/or firmware modules and one or more sets of data that can be stored on local storage resources 1218 and be utilized during operations of IHS 1202. Specifically, in one embodiment, system memory 1214 can include therein a plurality of such modules, including one or more of application(s) 1220, operating system (OS) 1222, a firmware interface 1224 such as basic input/output system (BIOS) or Uniform Extensible Firmware Interface (UEFI), and platform firmware (FW) 1226. These software and/or firmware modules have varying functionality when their corresponding program code is executed by host processor subsystem 1212 or secondary processing devices within IHS 1202. For example, application(s) 1220 may include a word processing application, a presentation application, and a management station application, among other applications.

IHS 1202 further includes one or more input/output (I/O) controllers 1228 that support connection by and processing of signals from one or more connected input device/s \$30, such as a keyboard, mouse, touch screen, or microphone. I/O controllers 1228 also support connection to and forwarding of output signals to one or more connected output devices 1230, such as a monitor or display device or audio speaker (s). Additionally, in one or more embodiments, one or more device interfaces 1234, such as an optical reader, a universal serial bus (USB), a card reader, Personal Computer Memory Card International Association (PCMCIA) slot, and/or a high-definition multimedia interface (HDMI), can be associated with IHS 1202. Device interface(s) 1234 can be utilized to enable data to be read from or stored to corresponding removable storage device/s 1236, such as a compact disk (CD), digital video disk (DVD), flash drive, or flash memory card. In one or more embodiments, device interface(s) 1234 can further include general purpose I/O interfaces such as inter-integrated circuit ($I^2C$), system management bus (SMB), and peripheral component interconnect (PCI) buses.

Air handling system 1204 provides cooling air to meet the cooling requirements of IHSs 1202 in two or more zones 1240a, 1240z defined within enclosure 1242 of mobile MDC 1200. Air movers 1244 and mode actuators 1246 of AHUs 1248 of air handling system 1204 are controlled by AHU controller 1250. AHU controller 1250 can include some or all of the components and functionality described above for IHS 1202. In one or more embodiments, IHSs 1202 can communicate cooling requirements to AHU controller 1250, via device interface 1252 or network 1208, based on values provided by power consumption monitor 1254 and rack pressure, humidity, and temperature sensors 1256a-1256c. In one or more embodiments, AHU controller 1250 can determine cooling requirements based in part on outside environmental sensors, depicted as outside pressure sensor 1258a, outside temperature sensor 1260a, and outside temperature sensor 1262a. In one or more embodiments, AHU controller 1250 can determine cooling requirements for first zone 1240a based in part on cold aisle (CA) environmental sensors in first zone 1240a, depicted as CA pressure sensor 1258b, CA temperature sensor 1260b, and CA temperature sensor 1262b. In one or more embodiments, AHU controller 1250 can determine cooling requirements for first zone 1240a based in part on hot aisle (HA) environmental sensors in first zone 1240a, depicted as HA pressure sensor 1258c, HA temperature sensor 1260c, and HA temperature sensor 1262c.

In one or more embodiments, AHU controller 1250 can determine cooling requirements for second zone 1240z based in part on CA environmental sensors in second zone 1240z, depicted as CA pressure sensor 1258d, CA temperature sensor 1260d, and CA temperature sensor 1262d. In one or more embodiments, AHU controller 1250 can determine cooling requirements for second zone 1240z based in part on HA environmental sensors in second zone 1240z, depicted as HA pressure sensor 1258e, HA temperature sensor 1260e, and HA temperature sensor 1262e.

In one or more embodiments, AHU controller 1250 can control backflow prevention mechanism 1264 to close a supply air outlet of AHU 1248 that is deactivated. Adequate and cost effective cooling can be achieved in certain ambient or IT load conditions by activating one AHU 1248 and deactivating another AHU 1248 that share a supply air plenum 140 (FIG. 1). AHU controller 1250 can also close corresponding backflow prevention mechanism 1264 in response to a failure that deactivates one AHU 1248. AHU controller 1250 can also close corresponding backflow prevention mechanism 1264 in response to detecting that this location has no AHU 1248 installed.

Figure 13:
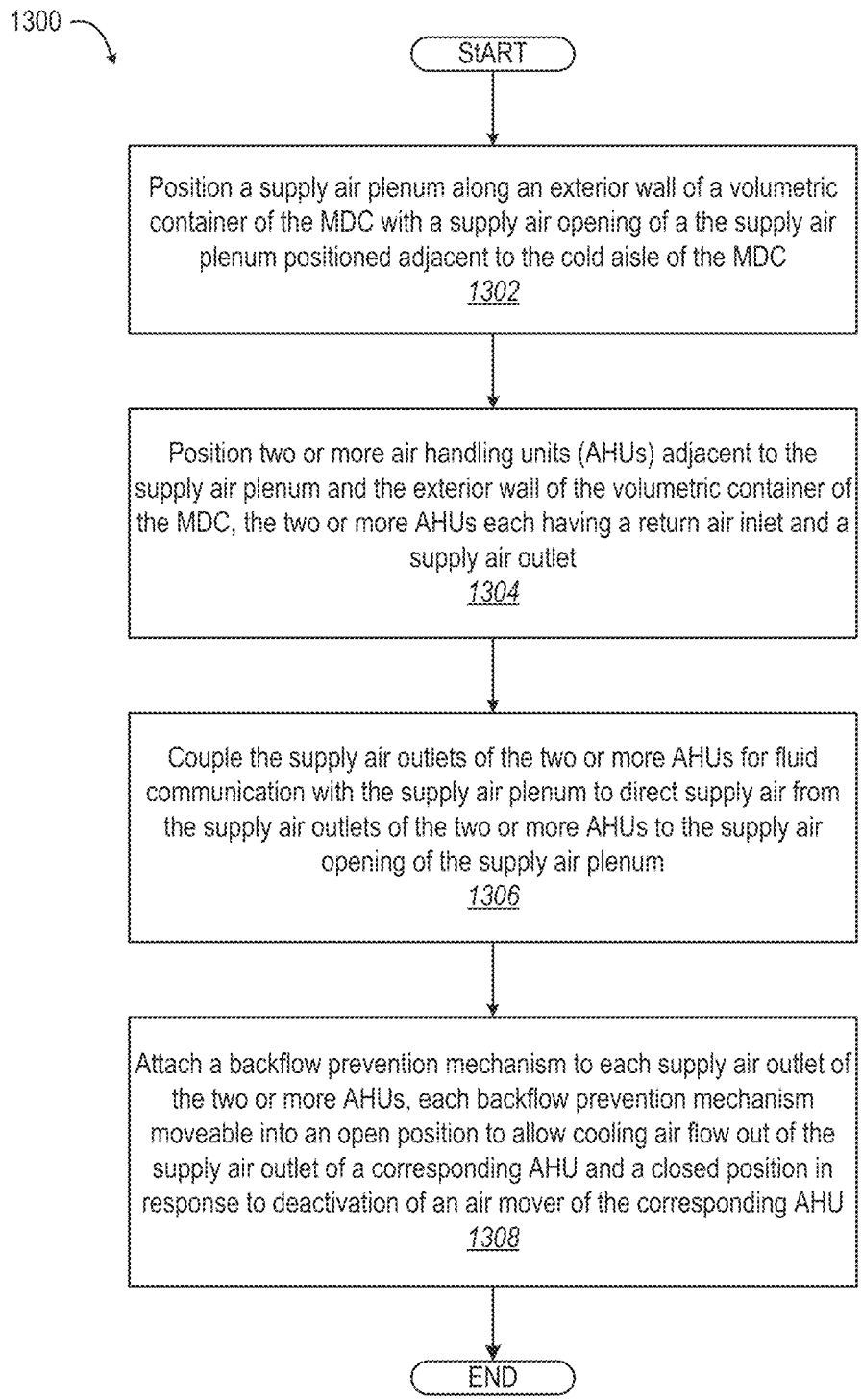
FIG. 13 is a flow diagram of a method for installing, by an automated manufacturing system, an air handling system of a mobile MDC, according to one embodiment.

FIG. 13 is a flow diagram of method 1300 for installing, by an automated manufacturing system, an air handling system of a mobile MDC that has IT components placed between a cold aisle and a hot aisle extending longitudinally within the MDC. The automated manufacturing system can be controlled by an information handling system, such as IHS 1202 of FIG. 12. In one or more embodiments, method 1300 includes positioning a supply air plenum along an exterior wall of a volumetric container of mobile MDC 1200 of FIG. 12, with a supply air opening of the supply air plenum positioned adjacent to the cold aisle of the MDC (block 1302). Method 1300 includes positioning two or more AHUs adjacent to the supply air plenum of the volumetric container of the MDC. The two or more AHUs each have a return air inlet and a supply air outlet (block 1304). Method 1300 includes coupling the supply air outlets of the two or more AHUs for fluid communication with the supply air plenum to direct supply air from the supply air outlets of the two or more AHUs to the supply air opening of the supply air plenum (block 1306). Method 1300 includes attaching a backflow prevention mechanism to each supply air outlet of the two or more AHUs. Each backflow prevention mechanism is moveable into an open position to allow cooling air flow out of the supply air outlet of a corresponding AHU. Each backflow prevention mechanism is moveable into a closed position in response to deactivation of an air mover of the corresponding AHU (block 1308). Then method 1300 ends.

In one or more embodiments, method 1300 includes attaching the backflow prevention mechanism by mounting a door to the corresponding supply air outlet that pivots about a horizontal axis from a closed position to an open position. In one or more embodiments, method 1300 includes attaching backflow prevention mechanism by attaching a flap along one edge of a respective supply air outlet. The flap includes a biasing structure that moves the flap into a closed position relative to the supply air outlet when the corresponding air mover is not functioning. The biasing structure is overcome when the corresponding air mover is activated to enable the flap to move into the open position. In one or more embodiments, method 1300 includes attaching the backflow prevention mechanism by mounting a damper having an electrical actuator that opens the damper concurrently with activation of the corresponding air mover. The electrical actuator closes the damper concurrently with deactivation of the corresponding air mover.

In one or more embodiments, method 1300 includes positioning the supply air outlets of the two or more AHUs to supply longitudinally directed cooling air to the supply air plenum to a first lateral side of the supply air opening. The supply air plenum laterally redirects the cooling air from the supply air outlets of each of the two or more AHUs laterally in a lateral direction toward the supply air opening. In a particular one or more embodiments, method 1300 includes attaching an air turning vane to the first lateral side of a selected supply air outlet. The air turning vane comprising a stationary barrier that curves toward the second lateral side. In a particular one or more embodiments, method 1300 includes attaching the backflow prevention mechanism by attaching a door to the corresponding supply air outlet, where the door pivots about a horizontal axis at the first lateral side of the corresponding supply air outlet from a closed position to an open position to function as an air turning vane.

In the above described flow charts of FIG. 13 one or more of the methods may be embodied in air handling system controller 1250 (FIG. 12) that performs a series of functional processes. In some implementations, certain steps of the methods are combined, performed simultaneously or in a different order, or perhaps omitted, without deviating from the scope of the disclosure. Thus, while the method blocks are described and illustrated in a particular sequence, use of a specific sequence of functional processes represented by the blocks is not meant to imply any limitations on the disclosure. Changes may be made with regards to the sequence of processes without departing from the scope of the present disclosure. Use of a particular sequence is therefore, not to be taken in a limiting sense, and the scope of the present disclosure is defined only by the appended claims.

One or more of the embodiments of the disclosure described can be implemented, at least in part, using a software-controlled programmable processing device, such as a microprocessor, digital signal processor or other processing device, data processing apparatus or system. Thus, it is appreciated that a computer program for configuring a programmable device, apparatus or system to implement the foregoing described methods is envisaged as an aspect of the present disclosure. The computer program may be embodied as source code or undergo compilation for implementation on a processing device, apparatus, or system. Suitably, the computer program is stored on a carrier device in machine or device readable form, for example in solid-state memory, magnetic memory such as disk or tape, optically or magneto-optically readable memory such as compact disk or digital versatile disk, flash memory, etc. The processing device, apparatus or system utilizes the program or a part thereof to configure the processing device, apparatus, or system for operation.

While the disclosure has been described with reference to exemplary embodiments, it will be understood by those skilled in the art that various changes may be made, and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprise" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description but is not intended to be exhaustive or limited to the disclosure in the form disclosed. Many modifications and variations will be apparent to those of ordinary skill in the art without departing from the scope of the disclosure. The described embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. An air handling system comprising:
   two or more air handling units (AHUs) each having a return air inlet and a supply air outlet;
   a supply air plenum that is fluid communication with the supply air outlets of the two or more AHUs and that directs cooling air flow from the supply air outlets to a supply air opening positioned adjacent to a cold aisle of a data center;
   an air turning vane attached to a first lateral side of a selected supply air outlet and
   two or more backflow prevention mechanisms, each positioned respectively at each supply air outlet of the two or more AHUs, each backflow prevention mechanism moveable into an open position to allow cooling air flow out of the supply air outlet of a corresponding AHU and a closed position in response to deactivation of an air mover of the corresponding AHU.

2. The air handling system of claim 1, wherein the two or more backflow prevention mechanisms each comprise a door that pivots about a horizontal axis from the closed position to the open position.

3. The air handling system of claim 1, wherein the two or more backflow prevention mechanisms each comprise a flap attached along one edge of a respective supply air outlet and comprising a biasing structure that moves the flap into the closed position relative to the supply air outlet when the corresponding air mover is not functioning and is overcome when the corresponding air mover is activated to enable the flap to move into the open position.

4. The air handling system of claim 1, wherein the two or more backflow prevention mechanisms each comprise a damper having an electrical actuator that opens the damper concurrently with activation of the corresponding air mover and that closes the damper concurrently with deactivation of the corresponding air mover.

5. The air handling system of claim 1, wherein:
   the supply air outlets of the two or more AHUs that supply longitudinally directed cooling air to the supply air plenum are positioned to a first lateral side of the supply air opening; and
   the supply air plenum laterally redirects the cooling air from the supply air outlets of each of the two or more AHUs in a lateral direction toward the supply air opening.

6. The air handling system of claim 5, wherein the air turning vane comprises a stationary barrier that curves toward the second lateral side.

7. The air handling system of claim 1, wherein:
   the supply air outlets of the two or more AHUs that supply longitudinally directed cooling air to the supply air plenum are positioned to a first lateral side of the supply air opening;
   the supply air plenum laterally redirects the cooling air from the supply air outlets of each of the two or more AHUs in a lateral direction toward the supply air opening; and the two or more backflow prevention mechanisms each comprise a door that pivots about a vertical axis at the first lateral side of the corresponding supply air outlet from the closed position to the open position to function as an air turning vane.

8. A modular data center (MDC) comprising:
a volumetric container comprising an enclosure having first and second exterior walls at a forward and an aft end, connected by lateral exterior walls;
at least one heat generating information technology (IT) component positioned longitudinally within the container and between a cold aisle and a hot aisle running longitudinally along respective left and right interior sides of the volumetric container; and
an air handling system comprising:
two or more air handling units (AHUs) each having a return air inlet and a supply air outlet;
a supply air plenum that is fluid communication with the supply air outlets of the two or more AHUs and that directs cooling air flow from the supply air outlets to a supply air opening positioned adjacent to the cold aisle of the MDC;
an air turning vane attached to a first lateral side of a selected supply air outlet; and
two or more backflow prevention mechanisms, each positioned respectively at each supply air outlet of the two or more AHUs, each backflow prevention mechanism moveable into an open position to allow cooling air flow out of the supply air outlet of a corresponding AHU and a closed position in response to deactivation of an air mover of the corresponding AHU.

9. The MDC of claim 8, wherein the two or more backflow prevention mechanisms each comprise a door that pivots about a horizontal axis from the closed position to the open position.

10. The MDC of claim 8, wherein the two or more backflow prevention mechanisms each comprise a flap attached along one edge of a respective supply air outlet and comprising a biasing structure that moves the flap into the closed position relative to the supply air outlet when the corresponding air mover is not functioning and is overcome when the corresponding air mover is activated to enable the flap to move into the open position.

11. The MDC of claim 8, wherein the two or more backflow prevention mechanisms each comprise a damper having an electrical actuator that opens the damper concurrently with activation of the corresponding air mover and that closes the damper concurrently with deactivation of the corresponding air mover.

12. The MDC of claim 8, wherein:
the supply air outlets of the two or more AHUs that supply longitudinally directed cooling air to the supply air plenum are positioned to a first lateral side of the supply air opening; and
the supply air plenum redirects the cooling air from the supply air outlets of each of the two or more AHUs laterally in a lateral direction toward the supply air opening.

13. The MDC of claim 12, wherein the air turning vane comprises a stationary barrier that curves toward the second lateral side.

14. The MDC of claim 8, wherein:
the supply air outlets of the two or more AHUs that supply longitudinally directed cooling air to the supply air plenum are positioned to a first lateral side of the supply air opening;

the supply air plenum laterally redirects the cooling air from the supply air outlets of each of the two or more AHUs in a lateral direction toward the supply air opening; and
the two or more backflow prevention mechanisms each comprise a door that pivots about a vertical axis at the first lateral side of the corresponding supply air outlet from the closed position to the open position to function as an air turning vane.

15. A method for installing an air handling system of a mobile modular data center (MDC) having information technology (IT) components placed between a cold aisle and a hot aisle extending longitudinally within the MDC, the method comprising:
positioning a supply air plenum along an exterior wall of a volumetric container of the MDC with a supply air opening of the supply air plenum positioned adjacent to the cold aisle of the MDC;
positioning two or more air handling units (AHUs) adjacent to the supply air plenum and the exterior wall of the volumetric container of the MDC, the two or more AHUs each having a return air inlet and a supply air outlet;
coupling the supply air outlets of the two or more AHUs for fluid communication with the supply air plenum to direct supply air from the supply air outlets of the two or more AHUs to the supply air opening of the supply air plenum;
attaching an air turning vane to the first lateral side of a selected supply air outlet, the air turning vane comprising a stationary barrier that curves toward the second lateral side; and
attaching a backflow prevention mechanism to each supply air outlet of the two or more AHUs, each backflow prevention mechanism moveable into an open position to allow cooling air flow out of the supply air outlet of a corresponding AHU and a closed position in response to deactivation of an air mover of the corresponding AHU.

16. The method of claim 15, wherein attaching the backflow prevention mechanism comprises mounting a door to the corresponding supply air outlet that pivots about a vertical axis from the closed position to the open position.

17. The method of claim 15, wherein the attaching backflow prevention mechanism comprises mounting a flap attached along one edge of a respective supply air outlet, the flap comprising a biasing structure that moves the flap into the closed position relative to the supply air outlet when the corresponding air mover is not functioning and is overcome when the corresponding air mover is activated to enable the flap to move into the open position.

18. The method of claim 15, wherein attaching the backflow prevention mechanism comprises mounting a damper having an electrical actuator that opens the damper concurrently with activation of the corresponding air mover and that closes the damper concurrently with deactivation of the corresponding air mover.

19. The method of claim 15, further comprising:
positioning the supply air outlets of the two or more AHUs to supply longitudinally directed cooling air to the supply air plenum to a first lateral side of the supply air opening, the supply air plenum laterally redirects the cooling air from the supply air outlets of each of the two or more AHUs in a lateral direction toward the supply air opening.

20. The method of claim 15, further comprising:
positioning the supply air outlets of the two or more AHUs to supply longitudinally directed cooling air to the supply air plenum to a first lateral side of the supply air opening, the supply air plenum laterally redirects the cooling air from the supply air outlets of each of the two or more AHUs in a lateral direction toward the supply air opening,
wherein attaching the backflow prevention mechanism comprises attaching a door to the corresponding supply air outlet that pivots about a vertical axis at the first lateral side of the corresponding supply air outlet from the closed position to the open position to function as an air turning vane.

\* \* \* \* \*